United States Patent [19]
Lantsman et al.

[11] Patent Number: 5,800,688
[45] Date of Patent: Sep. 1, 1998

[54] APPARATUS FOR IONIZED SPUTTERING

[75] Inventors: Alexander D. Lantsman, Middletown; Thomas J. Licata, Monroe, both of N.Y.

[73] Assignee: Tokyo Electron Limited, Tokyo, Japan

[21] Appl. No.: 837,551

[22] Filed: Apr. 21, 1997

[51] Int. Cl.$^6$ .................................................. C23C 14/34
[52] U.S. Cl. .................. 204/298.11; 204/298.05; 204/298.06; 204/298.08; 204/192.12
[58] Field of Search .................... 204/192.12, 298.06, 204/298.08, 298.11, 298.19, 298.05

[56] References Cited

U.S. PATENT DOCUMENTS

| | | |
|---|---|---|
| Re. 34,106 | 10/1992 | Ohmi . |
| 3,594,295 | 7/1971 | Meckel et al. . |
| 4,464,223 | 8/1984 | Gorin . |
| 4,844,775 | 7/1989 | Keeble . |
| 4,863,549 | 9/1989 | Grunwald . |
| 4,999,096 | 3/1991 | Nihei et al. ............... 204/298.06 X |
| 5,178,739 | 1/1993 | Barnes et al. ............. 204/298.06 X |
| 5,401,350 | 3/1995 | Patrick et al. . |
| 5,431,799 | 7/1995 | Mosely et al. . |
| 5,449,432 | 9/1995 | Hanawa . |
| 5,468,296 | 11/1995 | Patrick et al. . |
| 5,540,800 | 7/1996 | Qian . |
| 5,540,824 | 7/1996 | Yin et al. . |
| 5,560,776 | 10/1996 | Sugai et al. . |
| 5,569,363 | 10/1996 | Bayer et al. ............... 204/298.11 X |

FOREIGN PATENT DOCUMENTS 61-190070  8/1986  Japan .

OTHER PUBLICATIONS

Sputtering of insulators in an RF discharge by B. A. Probyn, Vacuum, vol. 18, No. 5, 1968.

*Primary Examiner*—Nam Nguyen
*Attorney, Agent, or Firm*—Wood, Herron & Evans, L.L.P.

[57] ABSTRACT

An ionized physical vapor deposition apparatus is provided with a helical RF coil that surrounds the chamber wall opposite a space between a target and a substrate holder. The coil is behind a quartz window in the wall of the chamber, which protects the coil from adverse interaction with plasma. The coil is energized with RF energy, preferably in the 0.1 to 60 MHz range, to form a secondary plasma in a volume of the space between the substrate holder and the main plasma that is adjacent the target. A shield between the space and the dielectric material prevents coating from forming on the window. The shield is formed of a plurality of angled sections that are spaced to facilitate communication of a secondary RF plasma from adjacent the window to the volume of the chamber where the sputtered material is ionized, with the sections angled and spaced to shadow at least most of the target from the window. In one embodiment, a plurality of axially spaced frusto-conical sections are used, with axial gaps to interrupt current eddy paths around the chamber. In another embodiment, the sections are in the form of a plurality angled axially extending circumferentially spaced blades. The shields may be commonly or separately biased to control contamination and to optimize the uniformity of coating on the substrate and the directionality of the flux of ionized material at the substrate.

11 Claims, 2 Drawing Sheets

APPARATUS FOR IONIZED SPUTTERING

This invention relates to sputter coating, and more particularly, to an apparatus for conducting Ionized Physical Vapor Deposition (IPVD) of coating material onto substrates.

BACKGROUND OF THE INVENTION

The presence of sub-micron high aspect ratio features on Very Large Scale Integration (VLSI) semiconductor devices gives rise to the desire to coat contacts on the bottoms of such features or to fill such features with conductive metals in the course of semiconductor device manufacture. In many semiconductor device manufacturing applications, it is required or at least preferred to apply the coatings using physical vapor deposition processes. This need or preference has resulted in a need for directing sputtered materials toward the substrate in substantially straight lines oriented substantially normal to the substrate surface.

For example, in semiconductor device manufacture, it is necessary to metallize contacts at the bottoms of high aspect ratio lines and vias that are in the range of 0.25 to 0.35 microns in width. Metallizing such contacts by a sputter coating processes is desirable because sputtering presents commercial advantages in time, cost and simplicity of equipment over alternative processes, particularly where devices on the substrate would sustain damage if subjected to the elevated temperatures required with coating processes such as chemical vapor deposition (CVD). With the decreasing size of features, high aspect ratios of features and the preferability of applying coatings by physical vapor deposition in certain applications, increasing demands are made on the sputtering process to achieve higher and higher degrees of directionality of the sputtered material. Unless the paths of the particles of sputtered material incident onto the substrate can be maintained highly parallel and normal to the substrate surface, the attempt to sputter coat the bottoms of the high aspect ratio holes will result in coating the sides of the holes, in which event the sputter coating process does not achieve results that are satisfactory.

A sputter coating process is typically carried out by placing the substrate and a target of coating material into a vacuum chamber filled with an inert gas such as argon and creating a plasma in the gas, with the target being maintained at a negative potential, functioning as a cathode which supplies electrons to sustain the plasma. The target is typically part of a magnetron cathode assembly in which magnets behind the target trap the electrons over the surface of the target where they collide with atoms of the argon gas, stripping electrons from the atoms and converting them into positive ions. The argon ions are accelerated toward the negatively charged target where they collide with the surface and eject particles of target material. The ejected particles of target material propagate through the vacuum space where some strike and coat the substrate.

Various proposals have been made for causing the propagating particles to move in straight lines toward and normal to the substrate surface. Interposing a collimator between the target and substrate is one such method of achieving normal angles of incidence and improving incident particle directionality. Increasing the target to substrate spacing, known as long-throw sputtering, is another. Collimators provide a source of particulate contamination while both of these methods tend to substantially decrease the deposition rate.

A further method of directing sputtered material that has been given renewed consideration is the process of ionized sputtering. With ionized sputtering, often referred to as Ionized Physical Vapor Deposition or IPVD, coating material is sputtered from a target using conventional magnetron sputtering techniques, with a target energized with a negative DC or pulsed DC potential to release electrons, which produce positive ions of the gas in the chamber, which are attracted toward the target where they strike the surface and dislodge particles of the coating material. In IPVD, an additional plasma is created, such as by reactively coupling RF energy into the chamber downstream of the target, to ionize the sputtered material. A negative bias applied to the substrate attracts the positively ionized material particles, electrically accelerating them toward the substrate.

Research with IPVD has revealed that IPVD processes possess a number of drawbacks and problems that have precluded their practical use. Such processes have, for example, produced low overall efficiency. In particular, IPVD processes typically yield low deposition rates, with low ionization of the sputtered material and high film contamination. For example, with IPVD proposals of the prior art, the filling of high aspect ratio features has been found to deteriorate as sputtering power at the target increases. Such deterioration has limited the sputtering of aluminum alloys to 0.3 to 3 kW of DC power with a 12 inch magnetron target as compared to 12 to 30 kW that is typical for such target. The low sputtering power results in a low deposition rate that yields low productivity, e.g., 10 to 40 minutes of sputtering time per wafer as compared to the typical 45 seconds to 1 minute. Further, the coupling efficiency of RF energy into sputtered material has been found to be low unless operated at high pressure in the sputtering chamber, such as 30 to 40 mTorr of argon process gas as compared to sputtering pressures that are typically in the 1 to 5 mTorr range. The higher pressure results in poorer film properties and greater chamber and film contamination. Other problems that have resulted with IPVD are the sputtering of the RF electrode or element by the plasmas, the flaking of accumulated sputtered material that has deposited on the RF element, the shorting of the RF element by the plasmas or material that deposits on the element, and other plasma and material interactions with the electrode or element used to couple the RF energy into the plasma to ionize the sputtered material.

Accordingly, there is a need for an IPVD apparatus and method thereof that overcomes the drawbacks and problems of the prior art. In particular, there is a need for a practical and effective IPVD apparatus that produces acceptably high overall efficiency, particularly high deposition rates, high sputtered material ionization efficiency and low contamination of the deposited film. There is a particular need for an apparatus that produces a film of high uniformity and quality, while providing sufficiently high productivity for the process to be commercially useful.

SUMMARY OF THE INVENTION

A primary objective of the present invention is to provide an IPVD apparatus of high overall efficiency, particularly one that yields a high deposition rate, produces a high sputtered material ionization efficiency and that keeps deposited film contamination low. A particular objective of the present invention is to provide an IPVD apparatus that can be operated with a high sputtering power on the target with high energy coupling efficiency into a secondary plasma to ionize the sputtered material without the need to maintain the chamber at a relatively high sputtering pressure. A further objective of the present invention is to provide an apparatus in which adverse interaction between the plasmas in the chamber and the electrode or element used to couple the RF energy into the plasma to ionize the sputtered material is kept low, particularly the sputtering of, the flaking of sputtered material from, the potential shorting of the electrode.

According to the principles of the present invention, an IPVD apparatus is provided in which a main plasma is formed adjacent the target to sputter material from the target while an RF element such as a coil that surrounds the chamber inductively couples energy to a secondary plasma formed in a volume of the chamber between the main plasma and a substrate. The secondary plasma ionizes the sputtered material particles in flight while they are moving from the target so that the particles can be electrostatically accelerated toward the substrate in the ion-assisted deposition of the sputtered material onto the substrate. The preferred processor is provided with a configuration of protective structure that protects the RF ionization energy coupling element from adverse interaction with plasmas in the chamber, such as interaction with the main plasma as well as with the secondary RF plasma produced by the element. A shield array is provided to shield the protective structure from the target so that the function of the protective structure is not compromised by the effects of sputtered material deposition thereon.

In the preferred embodiments of the invention, a dielectric window is provided in the wall of the chamber surrounding the space between the target and the substrate. A helical coil surrounds the chamber behind the dielectric window. So arranged, the coil is protected from contact with the plasmas formed within the chamber. An array of shield sections is provided within the chamber, also surrounding the space between the target and substrate, and preferably biased to control the sputtering thereof by the plasmas. The shield array has a plurality of gaps to at least partially electrically separate the shield sections, in part to prevent induced eddy currents from consuming the energy and countering the coupling of energy to the plasma. The shield sections are configured and oriented, and the gaps are defined, to that the shield sections shadow the window from the target while minimally affecting the coupling of energy from the coil and the formation and location of the secondary plasma.

According to the preferred embodiment of the invention, a secondary plasma for ionizing sputtered material is created in the chamber by the coil by the coupling of RF energy to the gas in the chamber to form the secondary plasma for ionizing the sputtered material. The coil encircles the chamber and is outside of the chamber behind a quartz window. The quartz window thereby isolates the coil from the space between the target and the substrate that contains the plasmas. The coil is preferably a helical coil that surrounds the chamber behind the window, while the window is preferably cylindrical in shape in the wall of the chamber that surrounds the processing space such that the target and substrate are centered on the axes of the cylinder defined by window and the helix of the coil.

The shield array of the preferred embodiment is situated relative to the window, or other similarly functioning structure that protects the coil from the plasmas, so that coating does not build up on it that would support eddy currents therein or that would produce electrostatic shielding of the RF coil. Preferably, no part of the target is visible from any part of the window, and if any part of the window can see the target so as to accumulate a coating of conductive sputtering material, the coated area would not be so shaped as to allow it to support eddy currents or cause a significant shielding of the coil.

In the illustrated embodiments of the invention, the shield array is formed of angled sections that collectively entirely block all paths between the target and the window. The sections are also angled so that much of the volume of the space between the main plasma and the substrate is visible from the coil. As such, the window is protected from sputter deposition from the target while providing the greatest effective coupling of energy to form the secondary plasma for ionizing the sputtered material. The shield sections are preferably spaced from the window and have sufficient space between adjacent sections to allow some part of the coil to be in sight of the volume of the chamber where the secondary plasma is desired to be formed, so that plasma can be formed adjacent the window and extend into the volume where sputtered material can be ionized.

According to one embodiment of the invention, the shield array is formed of a plurality of axially spaced frusto-conical sections positioned inside of the window and inclined at an angle generally perpendicular to a path from the target to the window. The shield sections may be inclined at the same angle relative to the axis of the chamber or with the sections inclined at different angles, for example, with the sections at greater distances from the target at smaller angles to the axis. Preferably, the sections do not shadow adjacent sections from every point on the target, although a minimal overlap may tend to reduce scattered sputtered particles from striking the window. The shield sections are preferably further segmented circumferentially by gaps in the sections, thereby interrupting potential induced current paths.

According to a further embodiment of the invention, the shield array is formed of a plurality of flat or slightly curved axially extending rectangular blades circumferentially spaced around the chamber inside of the window. These sections are spaced from the window, and are each inclined at an angle relative to the radius of the chamber to collectively shadow the window, or at least the portion of the window substantially within the field of the coil, from the entire area of the target, but to allow some part of the coil to be in sight of the volume of the chamber where the secondary plasma is desired to be formed. In this way a secondary plasma can form adjacent the window and readily extend into the volume through which sputtered particles will pass. The shield sections of this embodiment are preferably inclined at the same angle relative to the radii of the chamber. Preferably, the sections do not shadow adjacent sections from every point on the target, although a minimal overlap may be effective to further reduce coating of the window. The shield sections are preferably circumferentially spaced from each other and spaced from the target and the substrate by a distance equal to at least the mean free path of molecules in the gas in the vacuum chamber.

With the present invention, sputtering power can be maintained at a high level, maintaining a high deposition rate and a high sputtered material ionization rate that yields high productivity with highly directional normally incident particles coating the substrate. The angled shield configuration in particular, in combination with the protected RF coil, make it possible to achieve deposited film qualities at deposition rates that make the IPVD process particularly commercially useful. In particular, high aspect ratio holes can be effectively filled and contacts at the bottoms of such holes can be coated. These results are achieved without the high incidence of the problems of shorting out the RF coil or increasing contamination and thereby the deterioration of the sputtered film. The need that is present in prior art systems to reduce sputtering power for IPVD is eliminated with systems embodying the present invention, as a dense sputtering plasma is prevented from shorting out or otherwise adversely affecting the RF plasma coupling element that creates the plasma that ionizes the sputtered material. The secondary plasma produced by the RF coil itself is prevented from shorting out the coil. Sputtering gas pressure may be kept at low or normal sputtering levels, and loss of directionality due to scattering is substantially reduced. Adverse effects from sputtering from the RF coupling element are avoided. These advantages are achievable in processing times that are comparable to conventional sputtering methods that do not provide the quality high aspect ratio feature coating that the present invention affords.

These and other objectives and advantages of the present invention will be more readily apparent from the following detailed description of the of the preferred embodiments of the invention, in which:

DETAILED DESCRIPTION OF THE PREFERRED EMBODIMENT

Figure 1:
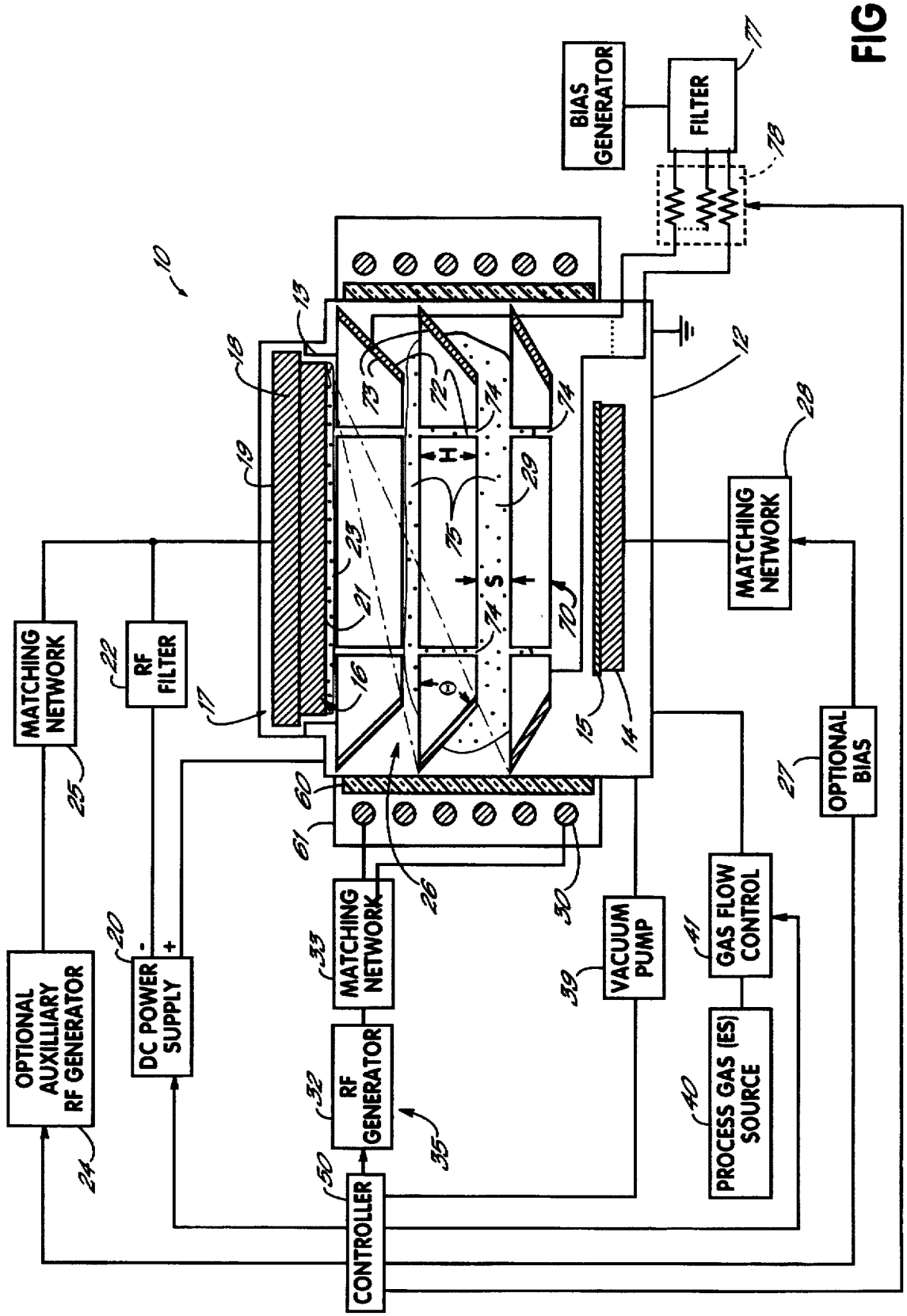
FIG. 1 is a diagrammatic representation of a IPVD sputtering apparatus according to one embodiment of the present invention.

FIG. 1 diagrammatically illustrates a sputter coating apparatus 10 according to principles of the present invention. The apparatus 10 includes a vacuum tight sputter processing chamber 12 having mounted therein a wafer support or susceptor 14 for supporting a semiconductor wafer 15 mounted thereon. A wafer 15 when mounted on the support 14 is parallel to and faces a target 16 of sputter coating material of a type that is to be deposited as a thin film on the wafer 15. A cylindrical space 11 is defined in the chamber 12 between the support 14 and the target 16. The target 16 is part of a cathode assembly 17 that includes a target holder 18, to which the target 16 is secured. A magnet pack 19 is provided behind the target holder 18 on the opposite side thereof from the support 14. A dark space shield 13 may also be provided around the periphery of the target 16. The magnet pack 19 preferably includes magnets that produce a closed magnetic tunnel that traps over the surface of the target 16 electrons given off by the cathode assembly 17 into gas within the chamber 12. The magnet pack 19 may include fixed or rotating or otherwise moving magnets, which may be permanent or electromagnets in the form of any one of a number of magnetron sputtering machines known in the art.

The apparatus 10 includes a power supply or source of DC power 20, which may be switched on to remain constant or may be pulsed. The power supply is preferably connected to the cathode assembly 17 through an RF filter 22. An auxiliary source of energy such as an RF generator 24 may also be optionally connected to the cathode assembly 17, which would be connected through a matching network 25. A bias circuit 27 is provided and connected to the substrate holder 14 through a matching network 28 to apply a bias to a wafer 15 mounted thereon. The power from the steady or pulsed DC power supply 20 and/or RF generator 24 produces a negative potential on the surface 21 which causes electrons to be emitted from surface 21 of the target 16 which remain trapped over the surface 21 by the magnetic field generated by the magnet pack 19 until they strike and ionize atoms of process gas in close proximity to the surface 21 of the target 16, forming a main plasma 23 adjacent to the target surface 21. This main plasma 23 becomes a source of positive ions of gas that are accelerated toward and against the surface 21 to eject particles of coating material from the target 16.

The space 11 between the target surface 21 and the substrate 15 on the support 14 can be considered as formed of two parts. One part is that occupied by the main plasma 23 while the second part of the space 11 is a volume 26 that lies between the plasma 23 and the substrate 15 and support 14. The particles of sputtered material from the target 16 generally originate as neutral in charge and propagate by momentum only through the space 11, where some, but not all, pass through the plasma 23 and the volume 26 to impinge upon the substrate 15. For the coating contacts at the bottoms of high aspect ratio holes and other features and for metallizing the holes by filling them with sputtered conductive material, it is highly preferred in VLSI semiconductor device manufacturing that the particles impinge onto the substrate surface in straight lines normal to the substrate, so they can proceed directly into the features to the bottoms. This normal impingement of particles on the substrate is facilitated in the apparatus 10 by ionizing the sputtered particles as they pass through the volume 26 and then electrostatically accelerating the ionized particles toward the substrate. Such a process is known in the art as ionized physical vapor deposition (IPVD) or ion assisted sputter coating.

According to certain principles of the present invention, in-flight ionization of sputtered particles in the space 26 is carried out by reactively and preferably inductively coupling RF energy into the volume by provision of an element that surrounds the volume 26 and preferably lies outside of the chamber 12, surrounding the chamber 12. The coil 30 is preferably in the form of a helical coil assembly 30, though coil configurations other than helical may be used. The coil 30 inductively couples energy into the gas in the volume 26 and energizes a secondary plasma 29 in the volume 26 that is distinct from the main plasma 23. An RF generator 32, preferably operative in the range of from 0.1 to 60 MHz, is connected to the element 30 through a matching network 33 to provide the energy to the coil 30 to form the secondary plasma 29.

A source of processing gas 40 is connected to the chamber 11, through a flow control device 41. For sputter processing, the gas from the supply 40 is typically an inert gas such as argon. A high vacuum pump 39 is also connected to the chamber 12 to pump the chamber to a vacuum in the milliTorr or sub-milliTorr range.

In the wall of the chamber 12, between the coil 30 and the space 11 there is provided protective structure that prevents the plasmas 23 and 29 from contacting and electrically interacting with the coil 30. This structure an electrically non-conductive material that does not impede the magnetic field surrounding the coil 30 from reaching into the volume 26. The preferred form of protective structure is that of a window 60, made of vacuum compatible dielectric material such as quartz, in the wall of the chamber 12, mounted to form a vacuum tight seal with the chamber wall. The window may be a single piece of insulating magnetically-transparent material or may be formed in joined segments thereof, to form a generally cylindrical protective structure. The coil 30 as illustrated is wound around the chamber 12 outside the window 60. Covering the coil 30 on the outside thereof is a conductive metal cover 61, which prevents electromagnetic energy radiating from the coil 30 and from within the chamber 12 to radiate outside of the chamber 12.

The window 60 itself is not electrically conductive, but it is susceptible to the accumulation of a coating of conductive material sputtered from the target 16. Electrical conductivity in or on the window 60 supports the induction of eddy currents, which undermine the effectiveness of the RF coupling to the plasma, and contributes to electrostatic shielding of the coil 30, rendering it less effective. Such conductivity of coating on the window 60, particularly in a circumferential direction or direction that extend wholly or substantially around the chamber 12 will effectively short out or negate the inductive coupling of energy into the volume 26 to form the plasma 29.

To prevent such buildup of conductive sputtered material on the window 60, a shield array 70 is provided between the space 11 and the window 60. The shield array 70 shadows the window 60 from material sputtered from the target 16, and preferably blocks all direct line of sight paths between any point on the surface 21 of the target 16 to the window 60. Nonetheless, according to the preferred embodiment of the present invention, the shield array 70 provides spaces or gaps 75 therein that have substantial uninterrupted area between the window 60 and the coil 30 behind the window 60 and the volume 26 into which the plasma 29 is to be coupled, thereby facilitating the coupling of energy from the coil 30 into the volume 26.

The shield array 70 is preferably in the form of a plurality of shields or shield segments 72 that collectively shadow the window 60 from the every point on the target 16. This shadowing eliminates most of the tendency for a buildup of sputtered film to form on the window 60. Accordingly, conductive paths or shielding do not form due to sputtered material coating build up at a significant rate on the window 60.

In one preferred embodiment of the invention, the shield segments are frusto conical in shape, with the insides 73 thereof facing the target 16, forming an angle θ with a plane parallel to the surface 21 of the target 16 and to the substrate 15 on the support 14. The angles θ of each shield segment 72 may be the same, but the effectiveness of the shield segments 72 can be enhanced or optimized by decreasing the angles θ in relation to the distance of the segment 72 from the target 16, so that the surface 73 of the segment 72 directly faces the target 16, providing maximum shadowing of the target 16 from the window 60 for a given segment area. The shield segments 72 lie outside of the space 11 and circumferentially surround the space 11, and are axially spaced from each other by the circumferential gaps or spaces 75. The maximum widths of the gaps 75 are the widest gaps S that still completely shadow the surface of the target 16 from the window 60, as illustrated by lines 77, so that circumferential bands of window 60 are not exposed to the target 16 so as to deposit an annular conductive strip around the window 60. Therefore, the maximum width S of the gaps 75 can be greater at greater distances form the target 16. The gaps 75 may be narrower, but should not be less than the mean free path of atoms of the process gas at the temperature and pressure of the chamber 12, and should be optimally spaced, given the process conditions, to facilitate the most efficient diffusion of the RF plasma into the volume 26. For the same reasons, the segments 72 each have heights H that may be the same for each segment 72 or varied to optimize the shadowing and spaces between the segments 72.

The ideal number of the shield segments 72 is dependent on the geometry of the chamber 12. While a single shield segment 72 can be used, typically two to six segments 72 will be employed. The number of segments 72 should be limited and the cumulative shield segment area should be minimized to minimize RF plasma losses. Furthermore, to prevent the formation of closed circumferential paths for eddy or other currents induced by the RF coil 30, the segments 72 should have at least one gap 74 interrupting each of them. The gaps 74 of the adjacent segments 72 may be in line as shown, or preferably may be staggered to prevent the deposition of a continuous line of film axially across the window 60. The gaps 74 should be sufficiently wide to prevent arcing, which, depending on the process parameters, will require widths of about ¼ th to 1 inches.

The gaps 74 are configured to substantially interrupt current paths in the shield array 70 and are configured to extend entirely or partially across the axial dimension of the array 70. The shields 72 may be made of a metal, a vacuum compatible dielectric material such as a ceramic or quartz, or some other compatible material selected to retain sputtered material coating thereon when such coating forms on the shields 72. Otherwise, such deposits will flake off and cause contamination of the chamber 12 and of wafers 15 being processed. In order to control the buildup of deposited material on the shield array 70 and thereby reduce the risk of contamination, the shield 70 may be electrically biased, and made of metal for that purpose. The shields are also preferably individually biased with their biases separately controllable for use in optimizing the distribution of film being deposited on the substrate, such as by optimizing the uniformity of coating on, and the directionality of ionized material onto, the substrate 15. In such a configuration, the gaps 74 will completely separate and electrically isolate each of the separately biased shield segments 72 from each other. The bias is provided by a generator 76 that is connected through a filter or matching network 77, with each shield separately connected through a current limiting resistor 78. The resistors 78 may be variable or other means may be provided for individually controlling the bias of the shield segments 72.

The apparatus 10 also includes a main controller 50 that is preferably a microprocessor based programmable controller operative to sequence and control the operation of the components discussed above. The controller 50 has outputs for controlling the energization of the cathode power supplies 20 and 24, the substrate bias power supply 27, the RF generator 32 for energizing the secondary plasma generating element that is the coil 30, the gas flow control 41, the pump 39, the current limiting resistors 78, and other controllable components of the apparatus 10.

Figure 3:
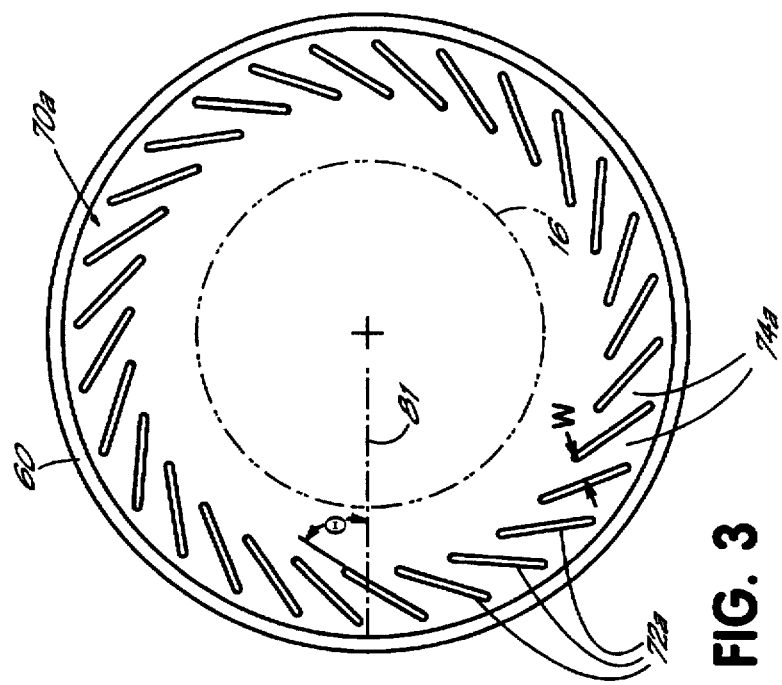
FIG. 3 is a cross-sectional view of the shield array embodiment of FIG. 2 taken along the line 3—3 of FIG. 2.
Figure 2:
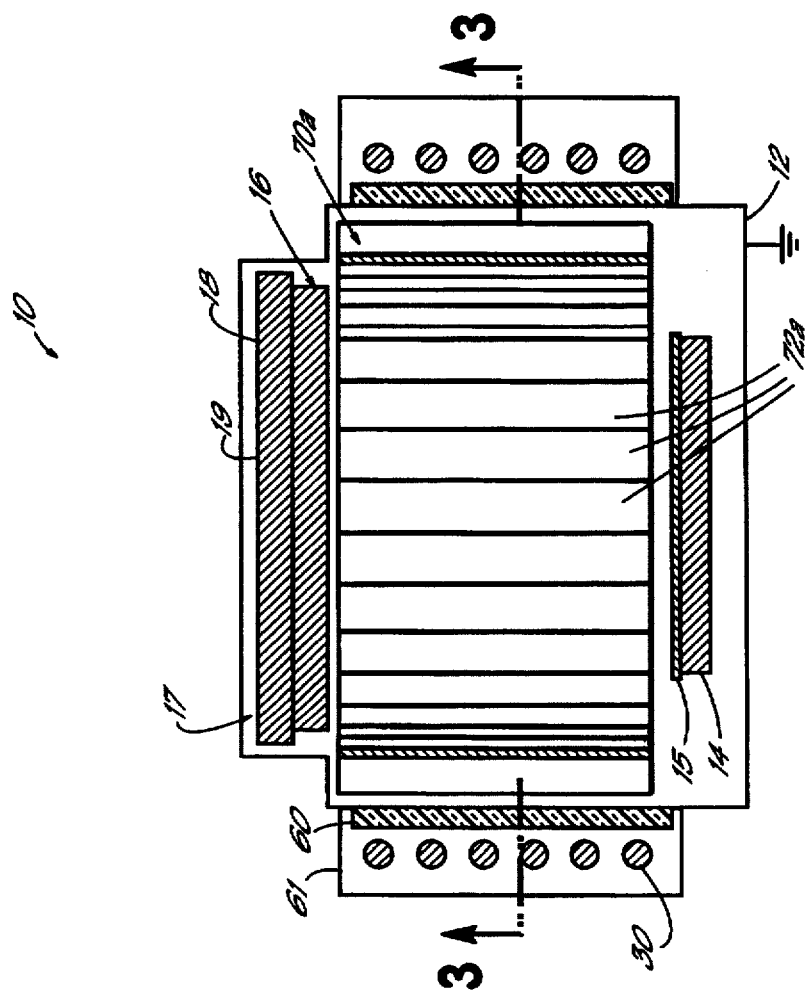
FIG. 2 is a diagram of a portion of FIG. 1 illustrating an alternative configuration of a shield array.

Advantages of the shield array 70, described above, may be realized by an alternative embodiment having a shield array 70a, as illustrated in FIGS. 2 and 3. The array 70a is formed of a plurality of flat or slightly curved rectangular segments 72a that are arranged as an array of blades or vanes around the perimeter of the space 11 inside of the window 60. The segments 72a are circumferentially spaced from each other by axial spaces or slots 74a, which provide space between the segments 72a for plasma to couple into the volume 26 as well as interrupt potential circumferential current paths around the array 70a. The orientation of the segments 72a is such that they each define an angle φ with a radial plane 81 through axis 82 of chamber 12. The spacing W between adjacent ones of the shield segments 72a and between the shield segments 72a and the window 60 should not be less than the mean free path of the gas in the chamber 12 so that the plasma 29 can effectively form adjacent the window 60 and propagate into the volume 26 in the gaps 74a between the segments 72a. The segments 72a are sufficiently long in the axial direction as to prevent any circumferential band of coating to form on the window 60 at the ends of the segments 72a, and are preferably set at angle φ and spaces W relative to each other to shadow the entire target 16 at the window 60.

In lieu of a window 60 the shield arrays described above may be used with a dielectric window provided inside of the chamber or with a coil in the chamber that is protected from the plasmas by insulation.

Those skilled in the art will appreciate that the implementation of the present invention herein can be varied, and that the invention is described in preferred embodiments. Accordingly, additions and modifications can be made without departing from the principles of the invention.

What is claimed is:

1. An ionized physical vapor deposition apparatus comprising:
    a vacuum sputtering chamber having opposite ends and a sidewall extending around the chamber between the ends, the sidewall having a dielectric window therein extending around the chamber;
    a sputtering target centered on an axis in the chamber at one end thereof and having a sputtering surface thereon;
    separately operable power supplies including (a) a cathode power supply for energizing a main plasma for ionizing gas in the chamber to produce ions of the gas to sputter the target sputter material from the sputtering surface of the target and (b) an RF energy source for producing a secondary plasma for ionizing material after it has been sputtered from sputtering surface of the target;
    the cathode power supply being connected to the target to energize the target to produce the main plasma in close proximity to the sputtering surface;
    a substrate support in the chamber at the end thereof opposite the target and spaced from the target to support a substrate parallel to the target;
    a coil outside of the chamber and surrounding the dielectric window opposite a volume of the chamber between the main plasma and the substrate holder;
    the RF energy source being connected to the coil to energize the coil to inductively couple RF energy through the window to the secondary plasma in the volume to ionize in-flight sputtered material when passing therethrough; and
    a shield encircling the chamber outside of the volume and formed of at least one inclined shield segment inside of and spaced from the window, each segment having a surface facing the target and inclined at an angle to the sputtering surface of the target and to the axis of the target to shadow substantially all points on the window from the sputtering surface of the target, the shield having at least one gap therein that interrupts circumferential current paths around the chamber and the shield being configured to facilitate the extension of the secondary plasma from adjacent the window into the volume.

2. The apparatus of claim 1 wherein:
    the shield includes a plurality of distinct shield segments.

3. The apparatus of claim 1 further comprising:
    a bias potential generator connected to the support to electrically bias a substrate on the support to accelerate ions of the sputtered material in a direction normal to the substrate.

4. The apparatus of claim 1 wherein:
    the shield includes a plurality of axially spaced frustoconical shield segments.

5. The apparatus of claim 1 wherein:
    the shield includes a plurality of circumferentially spaced blade-like shield sections having axially extending spaces there between.

6. The apparatus of claim 1 wherein:
    the coil is a helical coil positioned surrounding the chamber.

7. The apparatus of claim 1 wherein:
    the shield array is biased.

8. An ionized physical vapor deposition apparatus comprising:
    a vacuum sputtering chamber having a dielectric window therein extending around the chamber, a sputtering target therein centered on an axis at one end thereof and a substrate support therein for supporting a substrate parallel to the target on the axis at an opposite end thereof;
    separately operable power supplies including (a) a cathode power supply for energizing a main plasma for ionizing gas in the chamber to produce ions of the gas to sputter the target sputter material from the sputtering surface of the target and (b) an RF energy source for producing a secondary plasma for ionizing material after it has been sputtered from sputtering surface of the target;
    the cathode power supply being connected to the target to energize the target to produce the main plasma in close proximity to the target;
    an RF coil surrounding the chamber outside of the dielectric window positioned to inductively couple RF energy from the RF energy source into the chamber to form the secondary plasma in a volume of the chamber between the main plasma and the substrate holder; and
    a shield encircling the chamber between the volume and the window, the shield formed of a plurality of frustoconical sections inclined so as to generally face the target and spaced from each other so as to generally shadow substantially all points on the window from the target, the segments each having at least one axial gap therein to interrupt circumferential current paths around the chamber, the segments being spaced axially from each other to define space from the window into the volume effective to facilitate extension of the secondary plasma through the spaces from the window into the volume.

9. The apparatus of claim 8 further comprising:
    a bias potential generator connected to the support to electrically bias a substrate on the support to accelerate ions of the sputtered material in a direction normal to the substrate.

10. An ionized physical vapor deposition apparatus comprising:
    a vacuum sputtering chamber having a dielectric window therein extending around the chamber, a sputtering target therein at one end thereof and a substrate support therein for supporting a substrate parallel to the target at an opposite end thereof;
    separately operable power supplies including (a) a cathode power supply for energizing a main plasma for ionizing gas in the chamber to produce ions of the gas to sputter the target sputter material from the sputtering surface of the target and (b) an RF energy source for producing a secondary plasma for ionizing material after it has been sputtered from sputtering surface of the target;

the cathode power supply being connected to the target to energize the target to produce the main plasma in close proximity to the target;

an RF coil surrounding the chamber outside of the dielectric window positioned to inductively couple RF energy from the RF energy source to form the secondary plasma in a volume of the chamber between the main plasma and the substrate holder; and a shield encircling the chamber between the volume and the window, the shield formed of a plurality of axially extending blades circumferentially spaced from each other around the volume, each blade being inclined at an angle relative to a radial plane through the blade and through the central axis of the chamber, the blades being oriented and spaced from each other so as to generally shadow substantially all points on the window from the target, the blades each being spaced from each other to define space from the window into the volume effective to facilitate the extension of the secondary plasma into the volume.

11. The apparatus of claim 10 further comprising:

a bias potential generator connected to the support to electrically bias a substrate on the support to accelerate ions of the sputtered material in a direction normal to the substrate.

* * * * *